(12) United States Patent
Takahashi et al.

(10) Patent No.: US 8,372,938 B2
(45) Date of Patent: Feb. 12, 2013

(54) MASK MATERIAL COMPOSITION, METHOD OF FORMING IMPURITY DIFFUSION LAYER, AND SOLAR BATTERY

(75) Inventors: Motoki Takahashi, Kawasaki (JP); Toshiro Morita, Kawasaki (JP); Takaaki Hirai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 217 days.

(21) Appl. No.: 12/939,875

(22) Filed: Nov. 4, 2010

(65) Prior Publication Data
US 2011/0108095 A1    May 12, 2011

(30) Foreign Application Priority Data

Nov. 6, 2009  (JP) ................................. 2009-255387
Oct. 22, 2010  (JP) ................................. 2010-237107

(51) Int. Cl.
*C08G 77/00* (2006.01)

(52) U.S. Cl. ........................................................ 528/43

(58) Field of Classification Search ...................... 528/43
See application file for complete search history.

(56) References Cited

U.S. PATENT DOCUMENTS 5,470,491 A * 11/1995 Kodama et al. ................. 216/22
6,842,577 B2 *  1/2005 Shelnut et al. ................ 385/143

FOREIGN PATENT DOCUMENTS

JP    2007-049079    2/2007

OTHER PUBLICATIONS

DOW http://msdssearch.dow.com/PublishedLiteratureDOWCOM/dh_012d/0901b8038012d976.pdf?filepath=oxysolvents/pdfs/noreg/110-00977.pdf&fromPage=GetDoc (Date unknown).*

* cited by examiner

*Primary Examiner* — Kuo-Liang Peng
(74) *Attorney, Agent, or Firm* — Knobbe Martens Olson & Bear LLP

(57) ABSTRACT

A mask material composition that is used for diffusion barrier of an impurity diffusing component into a semiconductor substrate includes a siloxane resin (A1) containing a constituent unit represented by the following formula (a1):

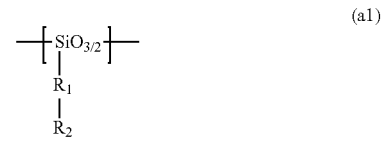

wherein $R_1$ is a single bond or $C_1$-$C_5$ alkylene group; and $R_2$ is a $C_6$-$C_{20}$ aryl group.

2 Claims, 1 Drawing Sheet

MASK MATERIAL COMPOSITION, METHOD OF FORMING IMPURITY DIFFUSION LAYER, AND SOLAR BATTERY

BACKGROUND OF THE INVENTION

1. Field of the Invention

The present invention relates to a mask material composition, a method of forming an impurity diffusion layer, and a solar battery.

2. Description of the Related Art

In the manufacture of solar batteries, formation of, for example, an N-type or P-type impurity diffusion layer into a semiconductor substrate has conventionally been performed as follows: patterning of a diffusing agent containing an N-type or P-type impurity diffusing component is performed on the surface of a semiconductor substrate; and the N-type or P-type impurity diffusing component is diffused from the patterned diffusing agent to form an N-type or P-type impurity diffusion layer. Specifically, a thermally-oxidized film is first formed on the surface of a semiconductor substrate, and then a resist with a predetermined pattern is laminated on the thermally-oxidized film by a photolithography method. By using the resist as a mask, part of the thermally-oxidized film, which is not masked with the resist, is etched with an acid or alkali and then the resist is peeled off to form a mask of the thermally-oxidized film. Subsequently, a diffusing agent containing an N-type or P-type impurity diffusing component is coated thereon to form a diffusion film on the part where the mask is open. Thereafter, an N-type or P-type impurity diffusion layer is formed by diffusing the impurity diffusing component in the diffusion film at high temperature.

With respect to such manufacture of solar batteries, Japanese Patent Application Publication 2007-49079 has disclosed a masking paste to be used as a diffusion control mask. By using such a masking paste, fine patterning in an impurity diffusion region can be easily formed without using a complicated photolithographic technique, etc., thereby, allowing for solar batteries to be manufactured at low cost.

Mostly, mirror-like finishing is not performed on the surface of a semiconductor substrate to be used in a solar battery. Also, a texture portion having a fine concave-convex structure is mostly formed on the surface of a semiconductor substrate to be used in a solar battery to prevent reflection of light on the surface thereof. Accordingly, when a mask is formed on the surface of such a semiconductor substrate, a mask material sometimes accumulates in the concave portions, thereby causing the film thickness of the mask to be large in the concave portions. In the conventional mask materials, there has been the fear that cracking may occur in the portions where the film thickness of the mask is large, and hence the diffusion barrier performance of the mask material may be deteriorated. Also, in the conventional mask materials, the molecular weight of the resin of which a mask material consists may increase due to a change over time. When the molecular weight of the resin increases, the properties of the mask material, such as viscosity, change, and accordingly the coating stability thereof is sometimes deteriorated.

SUMMARY OF THE INVENTION

The present invention has been made based on such recognition by the inventors, and a purpose of the invention is to provide: a mask material composition that can be preferably used in a mask to be formed for diffusion barrier in diffusing an impurity diffusing component into a semiconductor substrate; a method of forming an impurity diffusion layer using the mask material composition; and a solar battery.

In order to solve the aforementioned problem, an embodiment of the present invention is a mask material composition that is used for diffusion barrier of an impurity diffusing component into a semiconductor substrate, and the mask material composition includes a siloxane resin (A1) containing a constituent unit represented by the following formula (a1):

wherein $R_1$ is a single bond or $C_1$-$C_5$ alkylene group; and $R_2$ is a $C_6$-$C_{20}$ aryl group.

According to the embodiment, a mask material composition, which can be preferably used in a mask to be formed for diffusion barrier in diffusing an impurity diffusing component into a semiconductor substrate, can be provided.

Another embodiment of the present invention is a method of forming an impurity diffusion layer, which comprises: coating the mask material composition of the aforementioned embodiment selectively on a semiconductor substrate; and coating an impurity diffusing component selectively on the semiconductor substrate by using, as a mask, the mask material composition coated on the semiconductor substrate, so that the impurity diffusing component is diffused.

According to the embodiment, an impurity diffusion layer can be formed more accurately.

Still another embodiment of the present invention is a solar battery comprising a semiconductor substrate in which an impurity diffusion layer is formed by the method of forming an impurity diffusion layer of the aforementioned embodiment.

According to the embodiment, a more reliable solar battery can be obtained.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

Figure 1A:
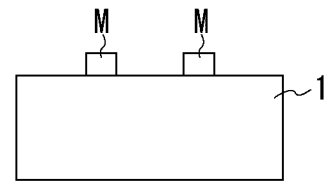
FIGS. 1A to 1F are process sectional views for explaining a method of manufacturing a solar battery including a method of forming an impurity diffusion layer according to an embodiment.

The invention will now be described by reference to the preferred embodiments. This does not intend to limit the scope of the present invention, but to exemplify the invention.

The present invention will now be described based on the preferred embodiments, which does not intend to limit the scope of the present invention, but to exemplify the invention. All the features described in the embodiments and combinations thereof are not always essential to the invention.

A mask material composition according to the present embodiment is used for diffusion barrier of an impurity diffusing component into a semiconductor substrate, and the mask material composition contains a siloxane resin (A) and a solvent (B). Hereinafter, each component of the mask material composition according to the embodiment will be described in detail.

<<Siloxane Resin (A)>>

A siloxane resin (A) is a resin of which the main body of a mask consists. The mask material composition according to the present embodiment includes, as the siloxane resin (A), a siloxane resin (A1) containing a constituent unit represented by the following formula (a1) (hereinafter, appropriately referred to as a constituent unit a1):

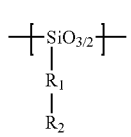

(a1)

wherein $R_1$ is a single bond or $C_1$-$C_5$ alkylene group; and $R_2$ is a $C_6$-$C_{20}$ aryl group.

Herein, the "constituent unit" means a monomer unit (monomeric unit) of which a high-molecular compound (polymer, copolymer) consists.

In the formula (a1), examples of $C_1$-$C_5$ alkylene group of $R_1$ include: straight-chain alkylene groups, such as methylene group, ethylene group, n-propylene group, and n-butylene group, etc.; and branched-chain alkylene groups, such as isopropylene group and t-butylene group, etc. A methylene group or an ethylene group is preferred as $R_1$.

In the formula (a1), examples of $C_6$-$C_{20}$ aryl group of $R_2$ include phenyl group, naphthyl group, and anthracenyl group, etc. This aryl group may have substituent groups, such as alkoxy group, hydroxy group, carboxy group, imino group, and amino group, etc. A phenyl group or a naphthyl group is preferred as $R_2$.

Specific examples of the constituent unit a1 include, for example: a constituent unit represented by the following formula (a1-1) (hereinafter, appropriately referred to as a constituent unit a1-1); that represented by the following formula (a1-2) (hereinafter, appropriately referred to as a constituent unit a1-2); that represented by the following formula (a1-3) (hereinafter, appropriately referred to as a constituent unit a1-3); and that represented by the following formula (a1-4) (hereinafter, appropriately referred to as a constituent unit a1-4), etc.

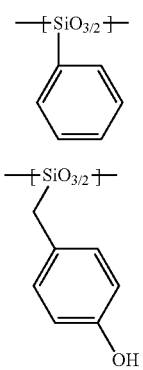

(a1-1)

(a1-2)

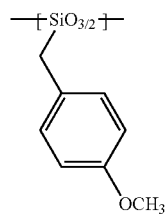

(a1-3)

(a1-4)

The siloxane resin (A1) may also contain a constituent unit represented by the following formula (a2) (hereinafter, appropriately referred to as a constituent unit a2) and that represented by the following formula (a3) (hereinafter, appropriately referred to as a constituent unit a3).

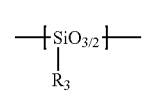

(a2)

wherein $R_3$ is a $C_1$-$C_{20}$ aliphatic hydrocarbon group, which may have substituent groups, such as alkoxy group, hydroxy group, carboxy group, imino group, and amino group, etc. The aliphatic hydrocarbon group may also be saturated or unsaturated. Examples of a saturated hydrocarbon group include, for example: straight-chain alkyl groups, such as methyl group, ethyl group, n-butyl group, hexyl group, octyldecyl group, dodecyl group, and octadecyl group, etc.; branched-chain alkyl groups, such as isopropyl group and t-butyl group, etc.; and cyclic alkyl groups, such as cyclopentyl group, cyclohexyl group, and norbornyl group, etc. Examples of an unsaturated hydrocarbon group include, for example, propenyl group (allyl group), butynyl group, 1-methyl propenyl group, and 2-methyl propenyl group, etc.

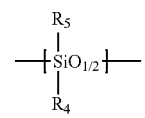

(a3)

wherein $R_4$ and $R_5$ are a $C_6$-$C_{20}$ aryl group or $C_1$-$C_{20}$ aliphatic hydrocarbon group. Specific examples of $C_6$-$C_{20}$ aryl group and $C_1$-$C_{20}$ aliphatic hydrocarbon group are as stated above.

Specific examples of the constituent unit a2 include methyl silsesquioxane monomer when $R_3$ is a methyl group, ethyl silsesquioxane monomer when $R_3$ is an ethyl group, and propyl silsesquioxane monomer when $R_3$ is a propyl group, etc. A specific example of a silsesquioxane resin, which is a copolymer of the constituent units a1 and a2, includes, for example, a resin represented by the following formula (A1-1):

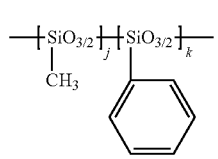

(A1-1)

wherein the ratio of j to k is within a range of 1:99 to 99:1.

In the copolymer of the constituent units a1 and a2, it is preferable that the copolymerization ratio of the constituent unit a1 is greater than or equal to 50%, that is, the ratio of j to k is within a range of 50:50 to 1:99, and it is more preferable that the copolymerization ratio of the constituent unit a1 is greater than or equal to 70%, that is, the ratio of j to k is within a range of 30:70 to 1:99.

Also, in the constituent unit a3, it is preferable that $R_4$ and $R_5$ are a $C_6$-$C_{20}$ aryl group.

The mask material composition according to the present embodiment includes the siloxane resin (A1) containing the constituent unit a1. The aryl group contained in the constituent unit a1 has a bulky structure. Accordingly, while a mask is being formed on the surface of a semiconductor substrate, bulky aryl groups are burned down by thermal curing of the mask material composition, thereby forming porous portions in the mask. Volume contraction, occurring due to bonding of the adjacent constituent units or of the adjacent polymers (silanol dehydration condensation), is moderately reduced by the porous portions. Therefore, it is possible that the mask is provided with flexibility by containing the constituent unit a1 having an aryl group. Thereby, occurrence of a cracking in the concave portions on the surface of a semiconductor substrate can be reduced, even if the film thickness of the mask is large in the concave portions. That is, the cracking resistance of the mask can be improved.

In addition, the constituent unit a1 has a structure in which a bulky aryl group is bonded to one of the four linking bonds of silicon (Si). Therefore, when compared to, for example, a conventional spin-on-glass (SOG), the siloxane resin (A) of which a mask is composed is less reactive and accordingly a change in the molecular weight is small. Therefore, it can be reduced that the molecular weight of the siloxane resin (A) may increase with a change over time. Thereby, a change in the properties of the mask material, such as viscosity, can be reduced and good coating stability can be maintained.

It is preferable that the siloxane resin (A1) is a silsesquioxane resin containing the constituent unit a1. Alternatively, the siloxane resin (A1) may be a silsesquioxane resin containing the constituent units a1 and a2. Because a silsesquioxane resin has a three-dimensional structure, such as basket-like structure, the silsesquioxane resin is likely to form a three-dimensional network structure. Accordingly, when the siloxane resin (A1) is a silsesquioxane resin, the cracking resistance of the mask can be enhanced compared to other siloxane resins.

Further, it is preferable that the siloxane resin (A1) is a silsesquioxane resin consisting only of the constituent unit a1. In this case, because the ratio of aryl groups to be contained in the mask can be increased, the cracking resistance of the mask can be improved, and the effect of improving the cracking resistance due to the silsesquioxane resin can be obtained. Examples of such a silsesquioxane resin include, for example, a resin represented by the following formula (A1-2):

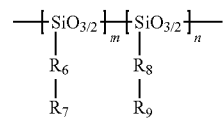

(A1-2)

wherein $R_6$ and $R_8$ are a single bond or $C_1$-$C_5$ alkylene group; $R_7$ and $R_9$ are an aryl group; an organic group consisting of $R_6$ and $R_7$ and that consisting of $R_8$ and $R_9$ may be the same or different; and when the two organic groups are different from each other, the ratio of m to n is within a range of 1:99 to 99:1.

Specific examples of the silsesquioxane resin represented by the formula (A1-2) include, for example: a resin represented by the following formula (A1-2a) (hereinafter, appropriately referred to as a silsesquioxane resin A1-2a) and that represented by the following formula (A1-2b) (hereinafter, appropriately referred to as a silsesquioxane resin A1-2b), etc.

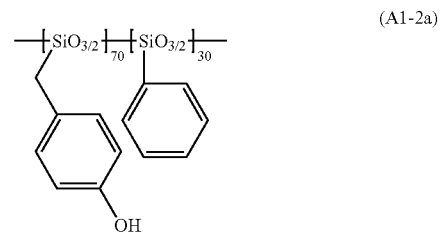

(A1-2a)

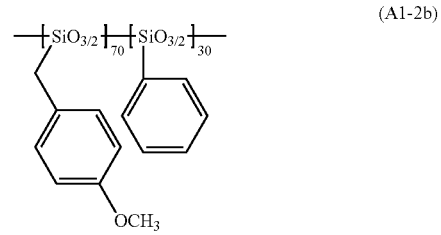

(A1-2b)

The mass average molecular weight of the siloxane resin (A1) is preferably within a range of 1000 to 30000, and more preferably within a range of 1500 to 10000. By making the mass average molecular weight thereof to be within such a range, good coating stability can be obtained.

The mask material composition may include, as the siloxane resin (A), a siloxane resin (A2) not containing the constituent unit a1. An example of the siloxane resin (A2) includes, for example: siloxane resin consisting of the constituent unit a2; that consisting only of the constituent unit a3; or that consisting of the constituent units a2 and a3, etc.

The resin concentration of the mask material composition is preferably within a range of 1 to 50%, and more preferably within a range of 5 to 40%. By making the resin concentration thereof to be within such a range, good coating stability can be obtained.

<<Solvent (B)>>

The solvent (B) may be any one as far as it can dissolve the siloxane resin (A). Specific examples of the solvent (B) include: alcohols, such as methanol, ethanol, isopropyl alcohol, and butanol, etc.; glycols, such as ethylene glycol, diethylene glycol, triethylene glycol, propylene glycol, dipropylene glycol, and tripropylene glycol, etc.; glycol derivatives, such as ethylene glycol monomethyl ether, ethylene glycol dimethyl ether, ethylene glycol monoethyl ether, ethylene glycol diethylether, ethylene glycol monopropyl ether, ethylene glycol dipropyl ether, diethylene glycol monomethyl ether, diethylene glycol dimethyl ether, diethylene glycol monoethyl ether, diethylene glycol diethyl ether, triethylene glycol monomethyl ether, triethylene glycol dimethyl ether, propylene glycol monomethyl ether, propylene glycol dimethyl ether, propylene glycol monoethyl ether, propylene glycol diethyl ether, propylene glycol monopropyl ether, propylene glycol dipropyl ether, dipropylene glycol monomethyl ether, dipropylene glycol dimethyl ether, dipropylene glycol monoethyl ether, dipropylene glycol diethyl ether, tripropylene glycol monomethyl ether, and tripropylene glycol dimethyl ether, etc.; ketones, such as acetone, methyl ethyl ketone, methyl isobutyl ketone, methyl amyl ketone, 3-pentanone, and cyclohexanone, etc.; esters, such as methyl acetate, ethyl acetate, butyl acetate, hexyl acetate, octyl acetate, acetic acid 2-ethylhexyl, acetic acid 3-methoxy butyl, ethylene glycol monomethyl ether acetate, propylene glycol monomethyl ether acetate, diethylene glycol monomethyl ether acetate, and diethylene glycol monobutyl ether acetate; polar solvents, such as dimethylformamide, dimethylacetoamide, dimethyl sulfoxide, N-methyl-2-pyrrolidone, γ-butyrolactone, ethylene carbonate, and propylene carbonate, etc.; aromatic hydrocarbons, such as benzene, toluene, and xylene, etc.; and aliphatic hydrocarbons, such as hexane, heptane, octane, and cyclohexane, etc. These solvents may be used alone or in combination of two or more thereof.

It is preferable that the solvent (B) contains an organic solvent (B1) whose boiling temperature is higher than or equal to 100° C. By containing the organic solvent (B1), drying of the mask material composition can be reduced. Therefore, when an inkjet printing method is adopted for the formation of a mask pattern, clogging of an inkjet nozzle, occurring due to drying of a mask material composition, can be prevented. Also, when a screen printing method is adopted for the formation of a mask pattern, it can be prevented that a mask material composition may be dried on a printing plate and adhere thereto. Accordingly, by containing the organic solvent (B1) in the solvent (B), a high-accuracy mask pattern can be formed on a semiconductor substrate. When the organic solvent (B1) is to be contained in the solvent (B), it is preferable that the organic solvent (B1) is contained in an amount of approximately 10 mass % or more based on the total mass of the solvent (B).

Specific examples of the organic solvent (B1) include: ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol dimethyl ether, ethylene glycol monomethyl ether acetate, ethylene glycol monoethyl ether acetate, ethylene glycol monopropyl ether acetate, propylene glycol monomethyl ether acetate, propylene glycol monoethyl ether acetate, propylene glycol monopropyl ether acetate, 2-methoxy butyl acetate, 3-methoxy butyl acetate, 4-methoxy butyl acetate, 2-methyl-3-methoxy butyl acetate, 2-ethoxy butyl acetate, 4-ethoxy butyl acetate, 4-propoxy butyl acetate, methyl isobutyl ketone, ethyl isobutyl ketone, cyclohexanone, propionic acid propyl, propionic acid isopropyl, methyl-3-methoxy propionate, ethyl-3-methoxy propionate, ethyl-3-ethoxy propionate, ethyl-3-propoxy propionate, propyl-3-methoxy propionate, isopropyl-3-methoxy propionate, butyl acetate, isoamyl acetate, methyl acetoacetate, methyl lactate, ethyl lactate, benzyl methyl ether, benzyl ethyl ether, benzene, toluene, xylene, butanol, isobutanol 3-methyl-3-methoxybutanol, hexanol, cyclohexanol, etc. These organic solvents may be used alone or in combination of two or more thereof.

Also, it is preferable that the solvent (B) contains an organic solvent (B2) whose boiling temperature is higher than or equal to 180° C. By containing the organic solvent (B2), drying of the mask material composition can be further reduced. Accordingly, when an inkjet printing method is adopted for the formation of a mask pattern, clogging of an inkjet nozzle, occurring due to drying of a mask material composition, can be prevented more surely. Also, when a screen printing method is adopted for the formation of a mask pattern, it can be prevented more surely that a mask material composition may be dried on a printing plate and adhere thereto. Accordingly, by containing the organic solvent (B2) in the solvent (B), a mask pattern with higher accuracy can be formed on a semiconductor substrate. When containing the organic solvent (B2) in the solvent (B), the organic solvent (B2) is preferably contained in an amount of 1 to 60 mass % based on the total mass of the mask material composition, more preferably contained in an amount of 5 to 50 mass %, and still more preferably contained in an amount of 10 to 40 mass %. By containing the organic solvent (B2) in an amount within such a range, good coating stability can be obtained.

Specific examples of the organic solvent (B2) include: ethylene glycol, propylene glycol, hexylene glycol, propylene glycol diacetate, 1,3-butylene glycol diacetate, diethylene glycol, dipropylene glycol, diethylene glycol monomethyl ether, diethylene glycol monoethyl ether, diethylene glycol monopropyl ether, diethylene glycol monobutyl ether, diethylene glycol monophenyl ether, diethylene glycol diethyl ether, dipropylene glycol monomethyl ether, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monophenyl ether acetate, dipropylene glycol monomethyl ether acetate, diethylene glycol monobutyl ether acetate, glycerin, benzyl alcohol, 3-methyl-3-methoxybutyl acetate, 3-ethyl-3-methoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, ethyl acetoacetate, butyl lactate, ethylhexyl lactate, dihexyl ether, benzyl acetate, ethyl benzoate, diethyl oxalate, diethyl maleate, γ-butyrolactone, and terpineol, etc. These organic solvents may be used alone or in combination of two or more thereof.

<<Others>>

The concentration of the metal impurities contained in the mask material composition is preferably smaller than or equal to approximately 500 ppb, and more preferably smaller than or equal to approximately 100 ppb. Also, the mask material composition may contain, as other additives, a common surfactant and thickener, etc. Examples of the surfactant include, for example, anionic compound, cationic compound, nonionic compound, etc. Among them, a nonionic surfactant is preferred in terms of reducing a pollution risk by the metal impurities.

It is preferable that the mask material composition substantially consists only of the siloxane resin (A1) and the solvent (B). In this case, when the impurity diffusing component is thermally diffused into a semiconductor substrate, the possibility of the semiconductor substrate being affected by the mask material composition can be reduced.

<<Method of Forming Impurity Diffusion Layer and Method of Manufacturing Solar Battery>>

Examples of a method of forming an impurity diffusion layer and a method of manufacturing a solar battery provided with a semiconductor substrate in which an impurity diffusion layer is formed by using the aforementioned method will be described with reference to FIGS. 1A to 1F. FIGS. 1A to 1F are process sectional views for explaining a method of manufacturing a solar battery including a method of forming an impurity diffusion layer according to an embodiment.

At first, a mask material composition M is selectively coated on an N-type semiconductor substrate 1, such as a silicon substrate, as illustrated in FIG. 1A. The mask material composition M is pattern-shaped after being selectively coated on the surface of the semiconductor substrate 1 by an inkjet method. That is, patterning is performed by discharging the mask material composition M from an inkjet nozzle of a known inkjet dispenser onto predetermined areas of the semiconductor substrate 1. As the inkjet dispenser, a piezoelectric dispenser using a piezo element is used, the piezo element being deformed when a voltage is applied. A thermal-type dispenser using air bubbles generated by heating may be used. After the mask pattern is formed, the mask material composition M is calcined to be dried.

Figure 1B:
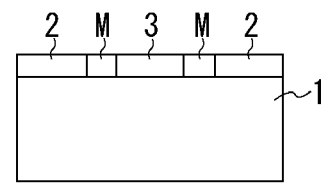

Subsequently, a diffusing agent composition 2 containing a P-type impurity diffusing component and a diffusing agent composition 3 containing an N-type impurity diffusing component are selectively coated on the semiconductor substrate 1 in accordance with the pattern of the mask material composition M formed on the semiconductor substrate 1, as illustrated in FIG. 1B. The diffusing agent compositions 2 and 3 are prepared by a well-known method.

Figure 1C:
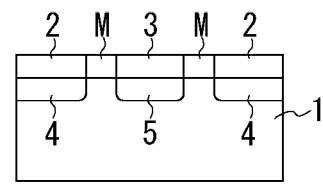

Subsequently, the semiconductor substrate 1, on which patterning of the diffusing agent compositions 2 and 3 are performed, is placed and calcined, for example, in a diffusion furnace, such as an electrical furnace, as illustrated in FIG. 1C, so that the P-type impurity diffusing component in the diffusing agent composition 2 and the N-type impurity diffusing component in the diffusing agent composition 3 are diffused into the semiconductor substrate 1 from the surface thereof. Alternatively, the semiconductor substrate 1 may be heated by radiation of commonly-used laser, instead of the diffusion furnace. Thus, a P-type impurity diffusion layer 4 is formed by the P-type impurity diffusing component being diffused into the semiconductor substrate 1, and an N-type impurity diffusion layer is formed by the N-type impurity diffusing component being diffused thereinto.

Figure 1D:
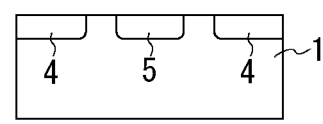

Subsequently, the mask material composition M, the diffusing agent composition 2, and the diffusing agent composition 3 are removed with a parting agent, for example, such as hydrofluoric acid, as illustrated in FIG. 1D.

Figure 1E:
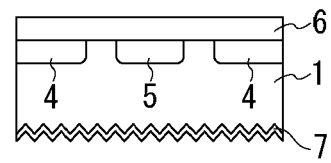

Subsequently, a passivation layer 6 is formed, by thermal oxidation, etc., on the surface of the semiconductor substrate 1 on the side where the P-type impurity diffusion layer 4 and the N-type impurity diffusion layer 5 are formed. Also, a texture structure with a fine concave-convex structure is formed, by a well-known method, on the surface of the semiconductor substrate 1 on the side opposite to the side where the passivation layer 6 is formed, so that a silicon nitride film 7 having the effect of preventing reflection of sunlight is formed thereon, as illustrated in FIG. 1E.

Figure 1F:
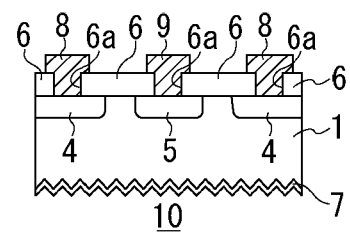

Subsequently, contact holes 6a are formed, with a well-known photolithography method and etching method, by selectively removing the passivation layer 6, so that predetermined areas of the P-type impurity diffusion layer 4 and the N-type impurity diffusion layer 5 are exposed, as illustrated in FIG. 1F. And then, by filling the contact hole 6a provided on the P-type impurity diffusion layer 4 with a desired metal, using, for example, electrolysis plating method or electroless plating method, an electrode 8 electrically connected with the P-type impurity diffusion layer 4 is formed. Likewise, an electrode 9 electrically connected with the N-type impurity diffusion layer 5 is formed in the contact hole 6a provided on the N-type impurity diffusion layer 5. With the aforementioned processes, a solar battery 10 according to the present embodiment can be manufactured.

As stated above, the mask material composition according to the present embodiment is used for diffusion barrier of an impurity diffusing component into a semiconductor substrate, and includes the siloxane resin (A1) containing the constituent unit a1. Because the constituent unit a1 contains a bulky aryl group, bonding of adjacent constituent units or adjacent polymers can be moderately reduced due to steric hindrance resulting from the aryl group. Accordingly, the mask can be provided with flexibility, which can improve the cracking resistance of the mask. In addition, the constituent unit a1 has a structure in which an aryl group is bonded to one of the four linking bonds of silicon (Si). Accordingly, it can be reduced that the molecular weight of the siloxane resin (A) may increase with a change over time, which can improve the cracking resistance of the mask. Accordingly, the mask material composition according to the present embodiment can be preferably used in a mask to be formed for diffusion barrier of an impurity diffusing component into a semiconductor substrate.

Also, by using a silsesquioxane resin containing the constituent unit a1 as the siloxane resin (A1), the cracking resistance of the mask material composition can be further enhanced. Also, by using a silsesquioxane resin consisting only of the constituent unit a1 as the siloxane resin (A1), the cracking resistance of the mask material composition can be further enhanced.

Also, with the mask material composition consisting only of the siloxane resin (A1) and the solvent (B), the influence on a semiconductor substrate by the mask material composition can be reduced. Also, by containing the organic solvent (B1) whose boiling temperature is 100° C. or higher in the solvent (B), drying of the mask material composition at room temperature can be reduced. Accordingly, the possibility of occurrence of printing blur can be reduced when the patterning of the mask material composition has been performed, thereby allowing a high-accuracy mask pattern to be formed.

Also, when an impurity diffusion layer is formed using the mask material composition according to the present embodiment, an impurity diffusion layer can be formed more accurately. And, when a semiconductor substrate, in which an impurity diffusion layer is formed by such a method of forming an impurity diffusion layer, is used in a solar battery, a more reliable solar battery can be obtained.

The present invention should not be limited to the aforementioned embodiments and various modifications, such as design modifications, can be made with respect to the embodiments based on the knowledge of those skilled in the art. Such combined or modified embodiments should also fall in the scope of the invention. New embodiments created by combining each of the aforementioned embodiments with each of the following variations would have both effects of the embodiments and the variations to be combined.

In the aforementioned embodiment, the mask material composition M is selectively coated on the semiconductor substrate 1 by, for example, an inkjet printing method; however, other printing methods, such as spin coat method, spray printing method, roll coat printing method, screen printing method, relief-printing method, and intaglio printing method, etc., may be used.

Also, in the aforementioned embodiments, the mask material composition is used in manufacturing solar batteries; however, the mask material composition is not particularly limited thereto, but can be used in manufacturing various semiconductor devices in which semiconductor elements are mounted.

EXAMPLES

Hereinafter, examples of the present invention will be described, which do not intend to limit the scope of the invention, but are presented as preferred illustrative examples of the invention.
[Examples in which Spin Coat Method is Used for Mask Formation]
(Production of Mask Material Composition)

Example 1

The silsesquioxane resin A1-2a (mass average molecular weight of 7500) was dissolved in propylene glycol monomethyl ether acetate (PGMEA) to produce a mask material composition containing the silsesquioxane resin A1-2a in an amount of approximately 30 mass % based on the total mass of the mask material composition, which was a final product.

Example 2

The silsesquioxane resin A1-2b (mass average molecular weight of 7000) was dissolved in propylene glycol monomethyl ether acetate (PGMEA) to produce a mask material composition containing the silsesquioxane resin A1-2b in an amount of approximately 30 mass % based on the total mass of the mask material composition.

Example 3

A silsesquioxane resin consisting of the constituent unit a1-1 (mass average molecular weight of 3500) was dissolved in propylene glycol monomethyl ether acetate (PGMEA) to produce a mask material composition containing the silsesquioxane resin in an amount of approximately 30 mass % based on the total of the mask material composition.

Example 4

A silsesquioxane resin consisting of the constituent unit a1-4 (mass average molecular weight of 4000) was dissolved in propylene glycol monomethyl ether acetate (PGMEA) to produce a mask material composition containing the silsesquioxane resin in an amount of approximately 30 mass % based on the total mass of the mask material composition.

Comparative Example 1

A methyl silsesquioxane resin (mass average molecular weight of 2000) was dissolved in propylene glycol monomethyl ether acetate (PGMEA) to produce a mask material composition containing the methyl silsesquioxane resin in an amount of approximately 30 mass % based on the total mass of the mask material composition.

Comparative Example 2

A siloxane resin consisting of a constituent unit represented by the following formula (a4) (mass average molecular weight of 2000) was dissolved in propylene glycol monomethyl ether acetate (PGMEA) to produce a mask material composition containing the siloxane resin in an amount of approximately 30 mass % based on the total mass of the mask material composition.

(a4)

A nonionic surfactant (SF8421EG: made by Dow Chemical Co.) was added in each of the mask material compositions in an amount of approximately 0.1 mass % based of the total mass of the mask material composition, which was a final product.
(Mask Formation and Impurity Diffusion Layer Formation)

Each of the mask material compositions of Examples 1-4 and Comparative Examples 1 and 2 was coated on an N-type silicon wafer by a publicly-known spin coat method. After coated with the mask material composition, each silicon wafer was pre-baked at 100° C. for one minute, further at 200° C. for one minute. The film thickness of the mask material composition after pre-baked was approximately 2 μm. The film thickness was calculated from a difference in height of the thickness of the mask material composition that has been measured by using a surface profiler (DEKTAK made by Veeco Instruments Inc.). Subsequently, each silicon wafer was placed in an electric furnace to calcine the mask material composition by heating it at 600° C. for 30 minutes under $O_2$ atmosphere. Thereby, a mask was formed on the surface of each silicon wafer.

Subsequently, a boron-containing impurity diffusing agent (PBF 3P-31A: made by TOKYO OHKA KOGYO CO., LTD.) was coated on the mask by a publicly-known spin coat method. After coated with the diffusing agent, each silicon wafer was pre-baked at 100° C. for one minute, and further 200° C. for one minute. Subsequently, each silicon wafer was heated at 950° C. for 30 minutes under $N_2$ atmosphere to thermally diffuse the impurity diffusing component. After the thermal diffusion, each silicon wafer was immersed in hydrofluoric acid with a concentration of five mass % at 23° C. for ten minutes to peel off the diffusing agent and the mask.

As a Reference Example, a silicon wafer without a mask material composition coated thereon was prepared in which the impurity diffusing component was thermally diffused on the same conditions as each Example and Comparative Example.
(Evaluation of Cracking Resistance)

Presence of occurrence of cracking in the mask material composition after calcined was visually evaluated by using an optical microscope. The evaluation was made as follows: the case where no cracking was observed was determined to be "Good"; and the case where cracking was observed was determined to be "NG". The results of each Example, each Comparative Example, and the Reference Example are shown in Table 1.
(Evaluation of Masking Property)

As evaluation of the masking property, P/N determination was made, by using a P/N determination apparatus, in the area where the mask has been formed on the surface of a silicon wafer. As a reference for the evaluation of the masking property, a sheet resistance value (Ω/sq.) of a semiconductor substrate was measured by a four-probe method using a sheet resistance meter (VR-70 (made by Kokusai Electric Inc)). The results of each Example, each Comparative Example, and the Reference Example are shown in Table 1.

TABLE 1

|  | EXAMPLE 1 | EXAMPLE 2 | EXAMPLE 3 | EXAMPLE 4 | COMPARATIVE EXAMPLE 1 | COMPARATIVE EXAMPLE 2 | REFERENCE EXAMPLE |
|---|---|---|---|---|---|---|---|
| OCCURRENCE OF CRACKING | GOOD | GOOD | GOOD | GOOD | NG | NG | — |
| SHEET RESISTANCE VALUE (Ω/sq.) | 185 | 187 | 190 | 192 | 1250 | 879 | 36.5 |
| P/N DETERMINATION | N | N | N | N | P | P | P |

As shown in Table 1, no cracking was observed and no inversion of the conductivity type occurred in all Examples. In contrast, cracking occurred and inversion of the conductivity type occurred in all Comparative Examples. Also, no increase in the sheet resistance value was observed and preferred sheet resistance values were obtained in all Examples. From these results, it has been learned that the mask material composition of each Example is provided with high cracking resistance and masking property.

[Examples in which Inkjet Printing Method is Used for Mask Formation]

(Production of Mask Material Composition)

Resins were dissolved in solvents in accordance with the components and content ratios shown in the resin column and solvent column of Table 2, so that the mask material compositions according to Examples 5 to 11 and Comparative Examples 3 and 4 were produced. In the columns, the numbers in parentheses represent the content ratios. The unit of each value is mass % and the ratio of each component is based on the total mass of a mask material composition.

The abbreviations in Table 2 show the following compounds:

Resin A: silsesquioxane resin A1-2a (mass average molecular weight of 7500);

Resin B: silsesquioxane resin A1-2b (mass average molecular weight of 7000);

Resin C: silsesquioxane resin represented by the following formula (A1-2c) (mass average molecular weight of 5000);

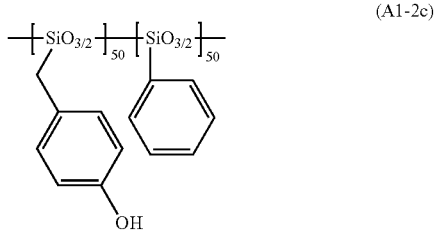

(A1-2c)

TABLE 2

|  | EXAMPLE 5 | EXAMPLE 6 | EXAMPLE 7 | EXAMPLE 8 | EXAMPLE 9 | EXAMPLE 10 | EXAMPLE 11 | COMPARATIVE EXAMPLE 3 | COMPARATIVE EXAMPLE 4 |
|---|---|---|---|---|---|---|---|---|---|
| RESIN | A(25) | A(25) | B(20) | C(30) | D(25) | E(25) | H(20) | F(20) | G(25) |
| SOLVENT | PGMEA (65) DPG (10) | PGMEA (75) | PGMEA (40) DPGM (40) | PGMEA (50) DPGM (20) | PGME (40) DPGM (35) | PGME (40) DPGM (35) | PGME (40) DPGM (40) | PGME (60) DPG (20) | PGME (65) DPG (10) |
| FILM THICKNESS (μm) | 2.0 | 2.0 | 2.0 | 2.0 | 2.0 | 2.0 | 2.0 | 2.0 | 2.0 |
| OCCURRENCE OF CRACKING | GOOD | GOOD | GOOD | GOOD | GOOD | GOOD | GOOD | NG | NG |
| SHEET RESISTANCE VALUE (Ω/sq.) | 185 | 190 | 187 | 187 | 190 | 192 | 195 | 583 | 122 |
| P/N DETERMINATION | N | N | N | N | N | N | N | P | P |
| PRINTING STABILITY | GOOD | ACCEPTABLE | GOOD | GOOD | GOOD | GOOD | GOOD | NG | NG |

Resin D: silsesquioxane resin represented by the following formula (A1-2d) (mass average molecular weight of 4500);

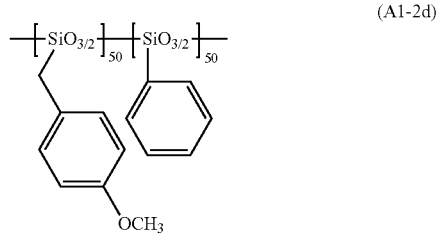

(A1-2d)

Resin E: silsesquioxane resin consisting of the constituent unit a1-1 (mass average molecular weight of 3500);
Resin F: siloxane resin consisting of the constituent unit represented by the above formula (a4) (mass average molecular weight of 2000);
Resin G: methyl silsesquioxane resin (mass average molecular weight of 2000);
Resin H: silsesquioxane resin represented by the following formula (A1-1a) (mass average molecular weight of 3000);

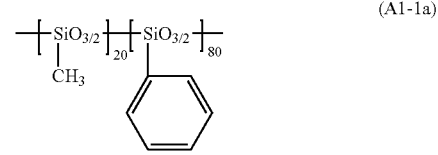

(A1-1a)

PGME: propylene glycol monomethyl ether;
PGMEA: propylene glycol monomethyl ether acetate;
DPG: dipropylene glycol; and
DPGM: dipropylene glycol monomethyl ether.

(Mask Formation and Impurity Diffusion Layer Formation)

Each of the mask material compositions of Examples 5 to 11 and Comparative Examples 3 and 4 was discharged and coated on a 6-inch N-type silicon wafer by using an inkjet dispenser (MID-500C made by Musashi Engineering, Inc.). A discharge frequency was set to be 8452 Hz. A resolution was 360 dpi×2160 dpi and a discharge resolution was 11.8 μm. Stage speed was set to be 100 mm/s and stage temperature to be 70° C. After a mask material composition was discharged, each silicon wafer was placed on a hot plate to be dried at 200° C. for three minutes. Thereafter, the mask material composition was pre-baked and calcined to form a mask on the surface of each silicon wafer in the same way as the aforementioned examples using a spin coat method. Subsequently, the boron-containing impurity diffusing agent was coated on the mask to thermally diffuse the impurity diffusing component. After the thermal diffusion, the diffusing agent and the mask were peeled off from each silicon wafer. In addition, the mask was formed continuously for five hours in order to evaluate, as the printing stability of a mask material composition, the difficulty of clogging of an inkjet nozzle being formed.

(Evaluation of Cracking Resistance)

Presence of occurrence of cracking was visually evaluated in the same way as the aforementioned Examples using a spin coat method. The results of each Example and each Comparative Examples are shown in Table 2.

(Measurement of Sheet Resistance Value)

The sheet resistance value ($\Omega$/sq.) of a semiconductor substrate was measured in the same way as the aforementioned Examples using a spin coat method. The results of each Example and each Comparative Example are shown in Table 2.

(Evaluation of Masking Property)

As evaluation of the masking property, P/N determination was made in the same way as the aforementioned Examples using a spin coat method. Also, as a reference for the evaluation of the masking property, the sheet resistance value ($\Omega$/sq.) of a semiconductor substrate was measured in the same way as the aforementioned Examples using a spin coat method. The results of each evaluation of each Example and each Comparative Example are shown in Table 2.

(Evaluation of Printing Stability)

Presence of partial lack of printing, so-called "printing blur", was evaluated, with an optical microscope, in the mask continuously formed for five hours. The evaluation was made as follows: the case where no blur was observed was determined to be "Good"; the case where blur was observed to an extent where the formation of the impurity diffusion layer was not affected was determined to be "Acceptable"; and the case where blur was observed to an extent where the formation thereof was affected was determined to be "NG". It is noted that the aforementioned "an extent where the formation of the impurity diffusion layer is affected" can be appropriately set by a person skilled in the art with experiments, etc. The results of each Example and each Comparative Example are shown in Table 2.

As illustrated in Table 2, no cracking was observed and no inversion of the conductivity type occurred in all Examples. In contrast, cracking occurred and inversion of the conductivity type occurred in all Comparative Examples. Also, no increase in the sheet resistance value was observed and preferred sheet resistance values were obtained in all Examples. From these results, it has been learned that the mask material composition of each Example is provided with high cracking resistance and masking property.

Further, all Examples exhibited higher printing stability than Comparative Examples. From this, it has been learned that the mask material composition of each Example is provided with high stability over time. Accordingly, the mask material composition of each Example can be preferably used in an inkjet printing method. Examples 5 and 7 to 11 containing dipropylene glycol or dipropylene glycol monomethyl ether, which are among the aforementioned organic solvents (B2), exhibited more excellent printing stability than Example 6 not containing the organic solvent (B2). From this, it has been learned that the mask material composition containing the organic solvent (B2) can be more preferably used in an inkjet printing method.

What is claimed is:

1. A method of forming an impurity diffusion layer, comprising:
   coating a mask material composition that is used for a diffusion barrier of an impurity diffusing component into a semiconductor substrate, wherein the mask material composition comprises a siloxane resin (A1) containing a constituent unit represented by the following formula (a1), selectively on a semiconductor substrate; and
   coating an impurity diffusing component selectively on the semiconductor substrate by using, as a mask, the mask material composition coated on the semiconductor substrate, so that the impurity diffusing component is diffused

(a1)

wherein R1 is a single bond or $C_1$-$C_5$ alkylene group; and R2 is a $C_6$-$C_{20}$ aryl group.

2. A solar battery comprising a semiconductor substrate in which an impurity diffusion layer is formed by the method of forming an impurity diffusion later of claim 1.